United States Patent
Cui et al.

(10) Patent No.: US 11,994,565 B2
(45) Date of Patent: May 28, 2024

(54) POTENTIAL DIFFERENCE EARLY-WARNING CIRCUIT AND SYSTEM

(71) Applicant: INSPUR SUZHOU INTELLIGENT TECHNOLOGY CO., LTD., Jiangsu (CN)

(72) Inventors: Jie Cui, Jiangsu (CN); Lemei Bao, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/043,972

(22) PCT Filed: Jul. 30, 2021

(86) PCT No.: PCT/CN2021/109629
§ 371 (c)(1),
(2) Date: Mar. 3, 2023

(87) PCT Pub. No.: WO2022/048366
PCT Pub. Date: Mar. 10, 2022

(65) Prior Publication Data
US 2023/0288496 A1    Sep. 14, 2023

(30) Foreign Application Priority Data
Sep. 4, 2020  (CN) .................... 202010922866.3

(51) Int. Cl.
*G01R 31/52*    (2020.01)
*G01R 31/28*    (2006.01)
(Continued)

(52) U.S. Cl.
CPC ......... *G01R 31/52* (2020.01); *G01R 31/2801* (2013.01); *H02H 3/26* (2013.01); *G01R 19/16576* (2013.01)

(58) Field of Classification Search
CPC ................ G01R 31/52; G01R 31/2801; G01R 19/16576; H02H 3/26
See application file for complete search history.

(56) References Cited

U.S. PATENT DOCUMENTS 5,995,348 A * 11/1999 McCartan .............. H02H 9/025
361/45
6,804,094 B2 * 10/2004 Kampmeyer ............ H02H 3/33
361/101
(Continued)

FOREIGN PATENT DOCUMENTS

CN    1155357 A    7/1997
CN    202268943 U    6/2012
(Continued)

OTHER PUBLICATIONS

International search report for PCT/CN2021/109629 dated Nov. 2, 2021.
(Continued)

*Primary Examiner* — Patrick Assouad
*Assistant Examiner* — Demetrius R Pretlow
(74) *Attorney, Agent, or Firm* — Dennemeyer & Associates LLC; Victoria Friedman

(57) ABSTRACT

A potential difference early-warning circuit, comprising: a sensing resistor (R2), (PCB GND); a first MOS (M1), a drain of the first MOS being connected to the sensing resistor (R2), and a source of the first MOS (M1) being connected to a safety ground (GND); an operational amplifier (U1A), a positive input end of the operational amplifier being connected to one end of the sensing resistor (R2), and a negative input end of the operational amplifier (U1A) being connected to the other end of the sensing resistor (R2); a second MOS (M2), a gate of the second MOS (M2) being connected to an output end of the operational amplifier (U1A), and a source of the second MOS (M2) being (Continued)

connected to the signal ground; and a controller, a first input end of the controller being connected to the drain of the second MOS (M2), and an output end of the controller being connected to the gate of the second MOS (M2).

20 Claims, 2 Drawing Sheets

(51) Int. Cl.
*H02H 3/26* (2006.01)
*G01R 19/165* (2006.01)

(56) References Cited

U.S. PATENT DOCUMENTS

| | | | |
|---|---|---|---|
| 10,416,223 B2 | 9/2019 | Kawamura | |
| 2005/0134367 A1* | 6/2005 | Johnson | G01R 35/005 |
| | | | 327/545 |
| 2008/0106833 A1* | 5/2008 | Lewinski | G01R 31/52 |
| | | | 361/49 |
| 2009/0102488 A1* | 4/2009 | Morini | G01R 31/52 |
| | | | 324/509 |
| 2010/0244850 A1* | 9/2010 | Yano | B60L 58/40 |
| | | | 324/510 |
| 2015/0219699 A1 | 8/2015 | Heller et al. | |
| 2016/0156179 A1* | 6/2016 | Walter | H02H 3/202 |
| | | | 361/91.1 |

FOREIGN PATENT DOCUMENTS

| | | |
|---|---|---|
| CN | 202433470 U | 9/2012 |
| CN | 203164351 U | 8/2013 |
| CN | 203561719 U | 4/2014 |
| CN | 206321742 U | 7/2017 |
| CN | 206583996 U | 10/2017 |
| CN | 107332441 A | 11/2017 |
| CN | 107589338 A | 1/2018 |
| CN | 110383614 A | 10/2019 |
| CN | 110502088 A | 11/2019 |
| CN | 112129990 A | 12/2020 |
| JP | 2008026010 A | 2/2008 |
| WO | 2018055666 A1 | 3/2018 |

OTHER PUBLICATIONS

Search report for Chinese application No. 202010922866.3 filed on Sep. 4, 2020.

* cited by examiner

POTENTIAL DIFFERENCE EARLY-WARNING CIRCUIT AND SYSTEM

CROSS-REFERENCE TO RELATED APPLICATIONS

This is a 35 U.S.C. 371 National Stage Patent Application of International Application No. PCT/CN2021/109629, filed Jul. 30, 2021, which claims priority to Chinese application 202010922866.3, filed Sep. 4, 2020, each of which is hereby incorporated by reference in its entirety.

The present disclosure claims priority to Chinese Patent Application no. 201020922866.3, filed to the China National Intellectual Property Administration on Sep. 4, 2020, and entitled "Potential Difference Early-Warning Circuit and System", which is incorporated herein disclosure reference in its entirety.

TECHNICAL FIELD

The present disclosure relates to the field of servers, and in particular, to a potential difference early-warning circuit and system.

BACKGROUND

The grounding technology is an important consideration factor in an electromagnetic compatibility (EMC) technology, and is an important technology which must be used for normal working of electrical devices or systems. This technology is not only a necessary means to protect facilities and personal safety, but also an important technical measure for suppressing electromagnetic interference (EMI), ensuring the EMC of equipment or systems, and improving the reliability of devices or systems.

Proper grounding can provide a low-impedance path for interference signals, and is the most effective method for suppressing a disturbance source. About half of EMC issues may be addressed. The currents of multiple parts of a circuit or system must form a current loop with the ground wire or ground plane.

The Ground (GND) on the server device is divided into multiple different GND attributes. They are generally classified into two categories: Printed Circuit Board (PCB) GND and safety GND (a ground end, that is, the part connected to the ground). The PCB GND is a signal ground, the signal ground refers to a signal reference ground of a circuit and an electronic device. A loop is formed by the signal, and is a low-impedance path through which a signal current flows back to a signal source. The purpose of the safety GND is to guide a failure current, and when an electric leakage occurs in a device, the leakage current must be discharged to the ground through the safety GND, so as to guarantee personal safety.

However, when the GND is not processed appropriately, a potential difference is formed in the common impedance between the two grounding points, thereby causing a grounding interference. At the same time, due to the voltage between different GND attributes, once a short circuit occurs, a short-circuit current will be formed. Due to the small resistance, the current value is very large. The short-circuit current would catch a fire easily, and cause a safety accident, not meeting the requirements of design of safety specification.

As shown in FIG. 1, in the prior art, two independent GNDs are isolated, and at the same time, in order to ensure a current return path of high-frequency noise of an EMC, two different GNDs are connected by a resistor and a capacitor. Because multiple computing nodes need to be assembled in the server cabinet, power needs to be supplied to all the computing nodes by the power supply unit in a centralized manner. The power supply unit is a power shelf in the server cabinet. The cabinet size of the power shelf is the same as that of the computing node, but the value of the current provided will be large.

Therefore, the potential of the PCB GND in the power half device is not necessarily the same as the potential of the safety ground. During actual testing and production line assembly, it often happens that the interface connector (the potential of the metal connector is the same as that of the PCB GND) on the PCB accidentally touches the cabinet (which is connected to the safety ground) to the occurrence of Sparking. When the Sparking occurs in a data center or a machine room, a fire accident is likely to be caused.

SUMMARY

In view of this, in order to overcome at least one aspect of the problem, an embodiment of the present disclosure provides a potential difference early-warning circuit, comprising the following components:

a sensing resistor, one end of the sensing resistor being connected to a signal ground;

a first Metal-Oxide-Semiconductor Field-Effect Transistor (MOS, the abbreviation for MOSFET, metal oxide semiconductor field effect transistor), a drain of the first MOS being connected to the other end of the sensing resistor, and a source of the first MOS being connected to a safety ground;

an operational amplifier, a positive input end of the operational amplifier being connected to one end of the sensing resistor, and a negative input end of the operational amplifier being connected to the other end of the sensing resistor;

a second MOS, a gate of the second MOS being connected to an output end of the operational amplifier, and a source of the second MOS being connected to the signal ground; and a controller, a first input end of the controller being connected to the drain of the second MOS, and an output end of the controller being connected to the gate of the second MOS;

wherein the operational amplifier is configured to transmit a corresponding level to the second MOS according to a magnitude of a potential difference between the signal ground and the safety ground, so as to control the second MOS to be turned on or turned off, so that the controller receives the corresponding level through the first input end, and then the controller controls the first MOS to be turned on or turned off according to the received level.

In some embodiments, the operational amplifier is further configured to send, in response to the potential difference between the signal ground and the safety ground not reaching a threshold, a high level to the second MOS to control the second MOS to be turned on, so as to make the first input end of the controller be connected to the signal ground, so that the controller receives a low level, and the controller outputs a low level through the output end of the controller, thereby turning off the first MOS.

In some embodiments, the potential difference early-warning circuit further comprises:

a first power supply, connected to a power supply end of the operational amplifier; and a first current-limiting resistor, one end of the first current-limiting resistor being connected to the first power supply, and the other end of the first current-limiting resistor being connected to the first input end of the controller.

In some embodiments, the operational amplifier is further configured to send, in response to the potential difference between the signal ground and the safety ground not reaching the threshold, a low level to the second MOS to control the second MOS to be turned off, so that a first input end of the controller receives a high level, and outputs a high level through an output end of the controller, thereby turning on the first MOS according to the high level.

In some embodiments, the potential difference early-warning circuit further comprises:
 a triode, a base of the triode being connected to the signal ground, a collector of the triode being connected to a second input end of the controller, and an emitter of the triode being connected to the safety ground;
 wherein the triode is configured to be turned on or turned off according to whether there is a potential difference between the signal ground and the safety ground, so that the second input end of the controller receives a corresponding level.

In some embodiments, the triode is further configured to be turned on when there is the potential difference between the signal ground and the safety ground, so as to make the second input end of the controller be connected to the signal ground, so that the controller prompts, after receiving a low level input by the second input end, that there is the potential difference between the current signal ground and the safety ground.

In some embodiments, the potential difference early-warning circuit further comprises:
 a second power supply connected to the collector of the triode; and
 a pull-up resistor, one end of the pull-up resistor being connected to the second power supply, and the other end of the pull-up resistor being connected to the collector of the triode.

In some embodiments, the triode is further configured to be turned off when there is no potential difference between the signal ground and the safety ground, so that the second input end of the controller receives a high level.

In some embodiments, the potential difference early-warning circuit further comprises:
 a second current-limiting resistor, one end of the second current-limiting resistor being connected to the base of the triode, and the other end of the second current-limiting resistor being connected to the signal ground.

Based on the same inventive concept, according to another aspect of the present disclosure, an embodiment of the present disclosure further provides a potential difference early-warning system, comprising the potential difference early-warning circuit according to the embodiment above.

The present disclosure has one of the following beneficial technical effects: in the solution provided by the present disclosure, automatic detection and discovery can be performed by a server once there is a potential difference between different GNDs of a circuit. When the threshold is exceeded, an alarm is controlled to be given to avoid a serious fire accident.

BRIEF DESCRIPTION OF THE DRAWINGS

To describe the methods in the embodiments of the present disclosure or in the existing technology more clearly, the following briefly describes the accompanying drawings required for describing the embodiments or the existing technology. Apparently, the accompanying drawings in the following description show merely some embodiments of the present disclosure, and a person of ordinary skill in the art may still derive other embodiments from these accompanying drawings without creative efforts.

DETAILED DESCRIPTION OF THE EMBODIMENTS

In order to make objects, methods and advantages of the present disclosure clearer, the present disclosure is further described in details below in combination with specific embodiments and with reference to the drawings.

It should be noted that all expressions using "first" and "second" in embodiments of the present disclosure are for the purpose of distinguishing two entities with the same name but not representing the same or identical parameters. It can be seen that "first" and "second" are only for the convenience of expression and should not be construed as limitations on the embodiments of the present application. It will not be described one by one in subsequent embodiments.

In an embodiment of the present disclosure, the controller may be a Complex Programmable Logic Device (CPLD), a Field Programmable Gate Array (FPGA), a Baseboard Manager Controller (BMC), a Central Processing Unit (CPU), or other types of controllers.

Figure 1:
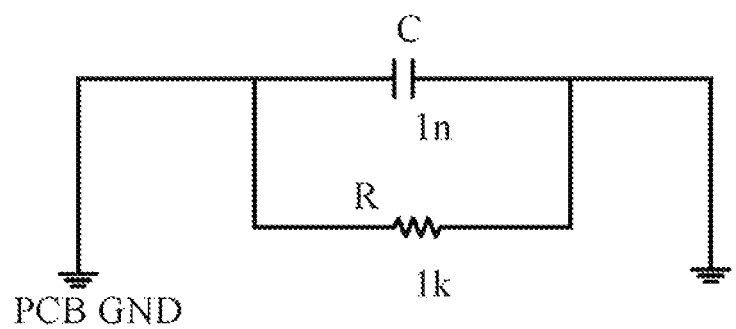
FIG. 1 is a schematic diagram of connections between different GNDs in the prior art provided in an embodiment of the present disclosure.
Figure 2:
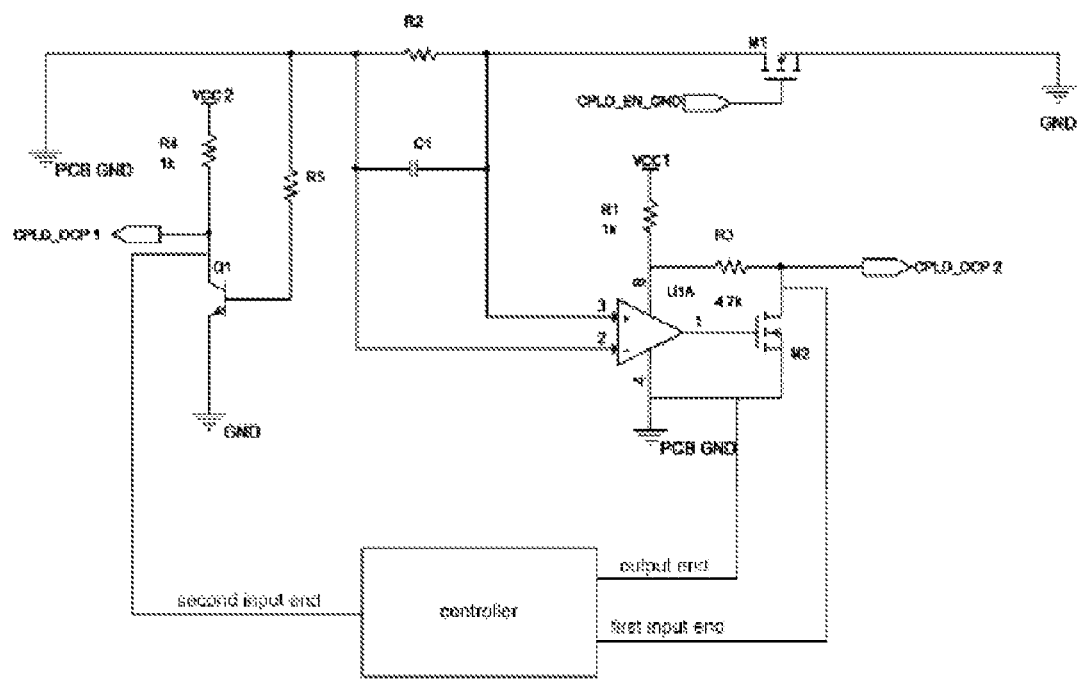
FIG. 2 is a schematic structural connection diagram of a potential difference early-warning circuit provided in an embodiment of the present disclosure.

According to one aspect of the present disclosure, an embodiment of the present disclosure provides a potential difference early-warning circuit. As shown in FIG. 2, the potential difference early-warning circuit may include:
 a sensing resistor R2, one end of the sensing resistor R2 being connected to a signal ground PCB GND;
 a first MOS M1, a drain of the first MOS M1 being connected to the other end of the sensing resistor R2, and a source of the first MOS being connected to a safety ground GND;
 an operational amplifier U1A, a positive input end 3 of the operational amplifier U1A being connected to one end of the sensing resistor R2, and a negative input end 2 of the operational amplifier being connected to the other end of the sensing resistor R2;
 a second MOS M2, a gate of the second MOS M2 being connected to an output end of the operational amplifier U1A, and a source of the second MOS being connected to the signal ground PCB GND; and
 a controller, a first input end of the controller being connected to the drain of the second MOS M2, and an output end of the controller being connected to the gate of the second MOS M2;
 wherein the operational amplifier U1A is configured to send a corresponding level to the second MOS M2 according to the magnitude of the potential difference between the signal ground PCB GND and the safety ground GND, so as to control the second MOS M2 to be turned on or turned off, so that the controller receives the corresponding level through the first input end, and then the controller controls the first MOS M1 to be turned on or turned off according to the received level.

According to the solution proposed in the present disclosure, automatic detection and discovery can be performed by a server once there is a potential difference between different GNDs of a circuit. When the threshold is exceeded, an alarm is controlled to be given to avoid a serious fire accident.

In some embodiments, the operational amplifier U1A is further configured to send, in response to the potential difference between the signal ground and the safety ground reaching a threshold, a high level to the second MOS M2 to control the second MOS M2 to be turned on, so as to make a first input end of the controller be connected to the signal ground, so that the controller receives a low level, and the controller outputs a low level through an output end of the controller, thereby turning off the first MOS M1.

In an embodiment, when there is the potential difference between the signal ground PCB GND and the safety ground GND, because the two ends of the sensing resistor R2 are respectively PCB GND and GND, there is a current at the two ends of the sensing resistor R2 due to the effect of the voltage. Therefore, the magnitude of the current can be determined by means of the potentials at two ends of the sensing resistor R2. When the potential difference exceeds a threshold, that is, the current exceeds the threshold (for example, 500 mA), the output end 1 of the operational amplifier U1A sends a high level to the second MOS M2, the second MOS M2 is turned on after receiving the high level, and the output signal CPLD_OCP2 outputs a low level, that is, the first input end of the controller is connected to the signal ground PCBGND, thereby receiving the low level. After receiving the low level, the controller sends an instruction to pull the output end CPLD_EN_GND from the high level to the low level, thereby turning off the first MOS M1.

It should be noted that, the purpose of providing the second MOS M2 is to provide a stable low-level or high-level input for the controller, so as to avoid mis-operation caused by unstable levels.

In some embodiments, the potential difference early-warning circuit further comprises:
  a first power supply VCC1 connected to a power supply end of the operational amplifier U1A;
  a first current-limiting resistor R3, one end of the first current-limiting resistor R3 being connected to the first power supply VCC1, and the other end of the first current-limiting resistor being connected to the first input end of the controller.

In some embodiments, the operational amplifier U1A is further configured to send, in response to the potential difference between the signal ground and the safety ground not reaching the threshold, a low level to the second MOS M2 to control the second MOS M2 to be turned off, so that the first input end of the controller receives a high level and outputs the high level through the output end of the controller, thereby turning on the first MOS M1 according to the high level.

In an embodiment, when it is determined by means of the potentials at the two ends of the sensing resistor R2 that the current exceeds the threshold (for example, 500 mA), that is, the potential difference between the signal ground and the safety ground exceeds the threshold, the output signal CPLD_OCP2 outputs a high level, that is, the first input end of the controller is connected to the first current-limiting resistor R3, thereby receiving the high level. After receiving the high level, the controller sends an instruction to output the high level to the output end CPLD_EN_GND, so as to turn on the first MOS M1 according to the high level.

In some embodiments, the potential difference early-warning circuit further comprises:
  a triode Q1, a base of the triode Q1 being connected to the signal ground, a collector of the triode being connected to a second input end of the controller, and an emitter of the triode being connected to the safety ground,
  wherein the triode Q1 is configured to be turned on or turned off according to whether there is the potential difference between the signal ground and the safety ground, so that the second input end of the controller receives a corresponding level.

In some embodiments, the triode Q1 is further configured to be turned on when there is the potential difference between the signal ground and the safety, so that the second input end of the controller is connected to the signal ground, and the controller prompts, after receiving a low level input by the second input end, that there is the potential difference between the current signal ground and the safety ground.

In some embodiments, the potential difference early-warning circuit further comprises:
  a second power supply VCC2 connected to a collector of the triode Q1; and
  a pull-up resistor R4, one end of the pull-up resistor R4 being connected to the second power supply VCC2, and the other end of the pull-up resistor being connected to the collector of the triode Q2.

In some embodiments, the triode Q1 is further configured to be turned off when there is no potential difference between the signal ground and the safety ground, so that the second input end of the controller receives a high level.

In some embodiments, the potential difference early-warning circuit further comprises:
  a second current-limiting resistor R5, one end of the second current-limiting resistor R5 being connected to the base of the triode Q1, and the other end of the second current-limiting resistor being connected to the signal ground.

In an embodiment, a triode Q1 may be used to detect whether there is the potential difference between the signal ground PCB GND and the safety ground GND, a corresponding signal CPLD_OCP1 is outputted, and the signal is connected to a second input end of the controller. Under normal circumstances, the signal is a high-level signal, and when there is the potential difference, the signal will be pulled down to become a low level.

It should be noted that, in FIG. 2, the plurality of PCB GNDs are turned on, and the plurality of GNDs are turned on.

Figure 3:
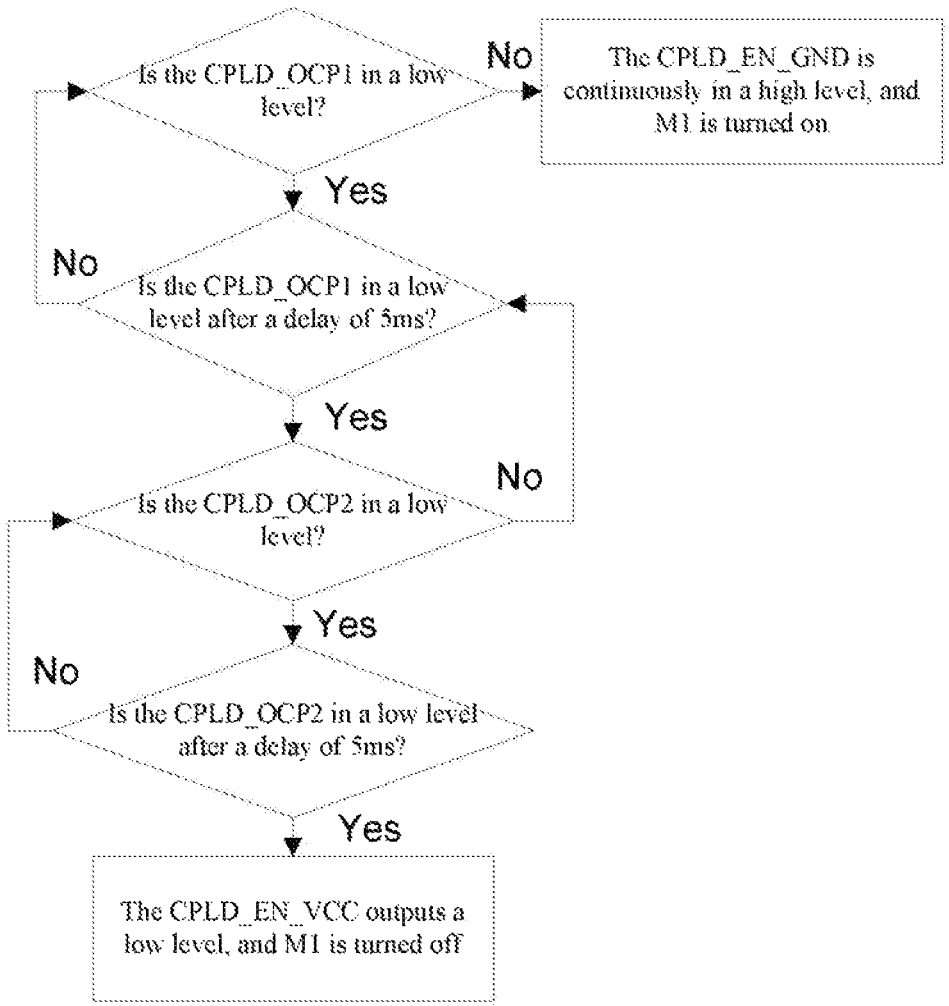
FIG. 3 is a flowchart of a potential difference early-warning method provided in an embodiment of the present disclosure.

According to one aspect of the present disclosure, an embodiment of the present disclosure proposes a potential difference early-warning method. As shown in FIG. 3, when a low level is detected at the second input end of the controller and the low level is still detected after a delay of a period of time, it indicates that there is the potential difference between the PCB GND and the safety ground GND, and then it is determined whether the low level is detected at the first input end of the controller; when the low level is detected and the low level is still detected after a delay of a period of time, it indicates that the potential difference between the PCB GND and the safety ground GND is greater than a threshold, and at this time, the low level needs to be output through an output end of the controller, to turn off the first MOS M1.

According to the solution proposed in the present disclosure, automatic detection and discovery can be performed by a server once there is a potential difference between different GNDs of a circuit. When the threshold is exceeded, an alarm is controlled to be given to avoid a serious fire accident.

Figure 4:
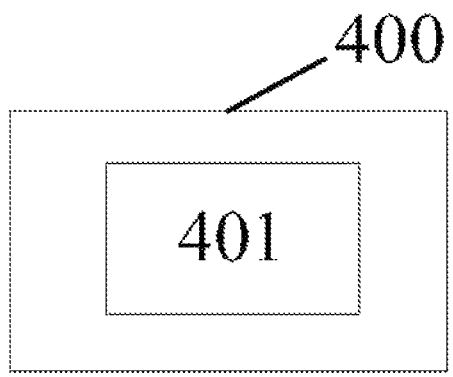
FIG. 4 is a schematic structural diagram of a potential difference early-warning system provided in an embodiment of the present disclosure.

Based on the same inventive concept, according to another aspect of the present disclosure, an embodiment of the present disclosure further provides a potential difference early-warning system 400. As shown in FIG. 4, the system comprises the potential difference early-warning circuit 401 according to any one of the embodiments above.

The above is the exemplary embodiment disclosed in the present disclosure. However, it is to be noted that multiple variations and modifications may be made without departing from the scope defined in the claims and disclosed in the embodiments of the present disclosure. The functions, steps, and/or actions in the method claims according to the disclosed embodiments described herein are not required to be executed in any specific sequence. In addition, the element disclosed in the embodiments of the present disclosure may be described or required in an individual form, but may be understood as a plural form, unless clearly limited to a singular form.

It should be understood that, as used herein, the singular form "a/an" is intended to include the plural form also, unless exceptional cases are supported clearly in the context. It should be understood that "and/or" used herein refers to including any or all possible combinations of one or more than one item that is listed associatively.

The sequence number of the described embodiments of the present disclosure are only for description, but do not denote the preference of the embodiments.

Those of ordinary skill in the art would have understood that the discussion of any embodiment above is merely exemplary and is not intended to imply that the scope of the disclosure (including the claims) is limited to these examples. Under the idea of the embodiments of the present disclosure, the technical features in the foregoing embodiments or in different embodiments may also be combined, and there are many other variations of different aspects of the foregoing embodiments of the present disclosure, which are not provided in details for simplicity. Therefore, any omissions, modifications, equivalent replacements, improvements, etc. made within the spirit and principle of the embodiments of the present disclosure shall all fall within the scope of protection of the embodiments of the present disclosure.

What is claimed is:

1. A potential difference early-warning circuit, comprising:
    a sensing resistor, one end of the sensing resistor being connected to a signal ground;
    a first Metal-Oxide-Semiconductor Field-Effect Transistor (MOS), a drain of the first MOS being connected to the other end of the sensing resistor, and a source of the first MOS being connected to a safety ground;
    an operational amplifier, a positive input end of the operational amplifier being connected to one end of the sensing resistor, and a negative input end of the operational amplifier being connected to the other end of the sensing resistor;
    a second MOS, a gate of the second MOS being connected to an output end of the operational amplifier, and a source of the second MOS being connected to the signal ground; and
    a controller, a first input end of the controller being connected to the drain of the second MOS, and an output end of the controller being connected to the gate of the second MOS;
    wherein the operational amplifier is configured to send a corresponding level to the second MOS according to a magnitude of a potential difference between the signal ground and the safety ground, so as to control the second MOS to be turned on or turned off, so that the controller receives the corresponding level through the first input end, and then the controller controls the first MOS to be turned on or turned off according to the received level.

2. The potential difference early-warning circuit as claimed in claim 1, wherein the operational amplifier is further configured to send, in response to the potential difference between the signal ground and the safety ground reaching a threshold, a high level to the second MOS to control the second MOS to be turned on, so that the first input end of the controller is connected to the signal ground, and the controller receives a low level, and the controller outputs the low level through the output end of the controller, thereby turning off the first MOS.

3. The potential difference early-warning circuit as claimed in claim 1, further comprising:
    a first power supply, connected to a power supply end of the operational amplifier; and
    a first current-limiting resistor, one end of the first current-limiting resistor being connected to the first power supply, and the other end of the first current-limiting resistor being connected to the first input end of the controller.

4. The potential difference early-warning circuit as claimed in claim 3, wherein the operational amplifier is further configured to send, in response to the potential difference between the signal ground and the safety ground not reaching a threshold, a low level to the second MOS to control the second MOS to be turned off, so that a first input end of the controller receives a high level, and outputs a high level through an output end of the controller, thereby turning on the first MOS according to the high level.

5. The potential difference early-warning circuit as claimed in claim 1, further comprising:
    a triode, a base of the triode being connected to the signal ground, a collector of the triode being connected to a second input end of the controller, and an emitter of the triode being connected to the safety ground;
    wherein the triode is configured to be turned on or turned off according to whether there is a potential difference between the signal ground and the safety ground, so that the second input end of the controller receives a corresponding level.

6. The potential difference early-warning circuit as claimed in claim 5, wherein the triode is further configured to be turned on when there is the potential difference between the signal ground and the safety, so as to make the second input end of the controller be connected to the signal ground, so that the controller prompts, after receiving a low level input by the second input end, that there is the potential difference between the current signal ground and the safety ground.

7. The potential difference early-warning circuit as claimed in claim 5, further comprising:
    a second power supply connected to the collector of the triode; and a pull-up resistor, one end of the pull-up resistor being connected to the second power supply, and the other end of the pull-up resistor being connected to the collector of the triode.

8. The potential difference early-warning circuit as claimed in claim 7, wherein the triode is further configured to be turned off when there is no potential difference between the signal ground and the safety ground, so that the second input end of the controller receives a high level.

9. The potential difference early-warning circuit as claimed in claim 5, further comprising:
   a second current-limiting resistor, one end of the second current-limiting resistor being connected to the base of the triode, and the other end of the second current-limiting resistor being connected to the signal ground.

10. A potential difference early-warning system, comprising the potential difference early-warning circuit;
   wherein the potential difference early-warning circuit comprises:
   a sensing resistor, one end of the sensing resistor being connected to a signal ground;
   a first Metal-Oxide-Semiconductor Field-Effect Transistor (MOS), a drain of the first MOS being connected to the other end of the sensing resistor, and a source of the first MOS being connected to a safety ground;
   an operational amplifier, a positive input end of the operational amplifier being connected to one end of the sensing resistor, and a negative input end of the operational amplifier being connected to the other end of the sensing resistor;
   a second MOS, a gate of the second MOS being connected to an output end of the operational amplifier, and a source of the second MOS being connected to the signal ground; and
   a controller, a first input end of the controller being connected to the drain of the second MOS, and an output end of the controller being connected to the gate of the second MOS;
   wherein the operational amplifier is configured to send a corresponding level to the second MOS according to a magnitude of a potential difference between the signal ground and the safety ground, so as to control the second MOS to be turned on or turned off, so that the controller receives the corresponding level through the first input end, and then the controller controls the first MOS to be turned on or turned off according to the received level.

11. The potential difference early-warning circuit as claimed in claim 2, wherein determine the potential difference through the potentials at two ends of the sensing resistor.

12. The potential difference early-warning circuit as claimed in claim 2, wherein when the potential difference between the signal ground and the safety ground reaching the threshold, the operational amplifier sends a high level to the second MOS; the second MOS is turned on after receiving the high level, and outputs a low level, so that the controller receives the low level.

13. The potential difference early-warning circuit as claimed in claim 1, wherein the second MOS is to provide a low level input or a high level input for the controller.

14. The potential difference early-warning circuit as claimed in claim 4, wherein when the potential difference between the signal ground and the safety ground does not reach the threshold, the operational amplifier sends a low level to the second MOS; the second MOS is turned off after receiving the low level, and outputs a high level, so that the controller receives the high level.

15. The potential difference early-warning circuit as claimed in claim 1, wherein when a low level is detected at the second input end of the controller and the low level is still detected after a delay of preset time, determining whether the low level is still detected at the first input end of the controller; when the low level is detected at the first input end of the controller and the low level is detected after a delay of the preset time, the controller outputs the low level to turn off the first MOS.

16. The potential difference early-warning system as claimed in claim 10, wherein the operational amplifier is further configured to send, in response to the potential difference between the signal ground and the safety ground reaching a threshold, a high level to the second MOS to control the second MOS to be turned on, so that the first input end of the controller is connected to the signal ground, and the controller receives a low level, and the controller outputs the low level through the output end of the controller, thereby turning off the first MOS.

17. The potential difference early-warning system as claimed in claim 10, further comprising:
   a first power supply, connected to a power supply end of the operational amplifier; and
   a first current-limiting resistor, one end of the first current-limiting resistor being connected to the first power supply, and the other end of the first current-limiting resistor being connected to the first input end of the controller.

18. The potential difference early-warning system as claimed in claim 10, wherein the operational amplifier is further configured to send, in response to the potential difference between the signal ground and the safety ground not reaching a threshold, a low level to the second MOS to control the second MOS to be turned off, so that a first input end of the controller receives a high level, and outputs a high level through an output end of the controller, thereby turning on the first MOS according to the high level.

19. The potential difference early-warning system as claimed in claim 10, further comprising:
   a triode, a base of the triode being connected to the signal ground, a collector of the triode being connected to a second input end of the controller, and an emitter of the triode being connected to the safety ground;
   wherein the triode is configured to be turned on or turned off according to whether there is a potential difference between the signal ground and the safety ground, so that the second input end of the controller receives a corresponding level.

20. The potential difference early-warning system as claimed in claim 10, wherein the triode is further configured to be turned on when there is the potential difference between the signal ground and the safety, so as to make the second input end of the controller be connected to the signal ground, so that the controller prompts, after receiving a low level input by the second input end, that there is the potential difference between the current signal ground and the safety ground.

* * * * *